United States Patent [19]

Keizer et al.

[11] 4,025,750
[45] May 24, 1977

[54] COMPLIANT ELECTRODE

[75] Inventors: Alan S. Keizer, Huntingdon Valley; Hans Strube, Holland; Harold Stewart, Hatboro, all of Pa.

[73] Assignee: The Jade Corporation, Huntingdon Valley, Pa.

[22] Filed: Dec. 29, 1975

[21] Appl. No.: 644,409

[52] U.S. Cl. .............................. 219/119; 219/85 F; 219/86
[51] Int. Cl.² ........................................ B23K 35/02
[58] Field of Search ....... 219/85 CA, 85 CM, 85 D, 219/85 F, 86, 87, 119

[56] References Cited

UNITED STATES PATENTS

| 2,266,424 | 12/1941 | Humphrey | 219/119 |
| 2,727,122 | 12/1955 | Gartner | 219/86 |
| 2,892,922 | 6/1959 | Hardesty | 219/119 X |
| 3,331,939 | 7/1967 | McConnell | 219/87 X |
| 3,521,026 | 7/1970 | Beneteau | 219/119 |
| 3,791,018 | 2/1974 | Johnston et al. | 219/85 D X |

FOREIGN PATENTS OR APPLICATIONS

| 246,622 | 6/1969 | U.S.S.R. | 219/85 D |

OTHER PUBLICATIONS

IBM Technical Disclosure Bulletin, vol. 11, No. 3, Aug. 1958, "Multipoint Thermocompression Bonder".

Primary Examiner—Bruce A. Reynolds
Assistant Examiner—N. D. Herkamp
Attorney, Agent, or Firm—Seidel, Gonda & Goldhammer

[57] ABSTRACT

An electrode assembly for simultaneously welding all the leads of a semiconductor chip to an outer lead frame is disclosed. The electrode assembly includes a gross electrode opposed to a plurality of spot electrodes, and a plurality of parallelogram support members for the spot electrodes, and a housing. Each of the plurality of parallelogram support members includes a first leg fixedly attached to the housing and a second leg supporting one of the spot electrodes. Each of the second legs is resiliently deformable into a stressed position when the electrode supported thereby is biased against the work piece whereby each spot electrode is independently responsive to structural changes in the work piece and contact is maintained between the work piece and the spot electrodes during the entire welding operation.

7 Claims, 6 Drawing Figures

COMPLIANT ELECTRODE

BACKGROUND AND SUMMARY OF THE INVENTION

The present invention relates to welding electrodes, more particularly compliant electrodes used to gang weld the intermediate leads of an integrated circuit chip to the outer leads supported by a lead frame.

The conventional method for bonding the leads of a semiconductor chip to an outer lead frame has been the wire bonding process. Typically, the operator uses a microscope to position the bonding tool and work piece through hand operated controls and then bonds the leads together. This operation is repeated for each lead on the semiconductor chip thus requiring as many full operations as there are leads on a chip; e.g., 16 on today's conventional chip. In addition to its time and labor cost, such a one-bond-at-a-time processing often results in chip failures due to human error. Recently, gang bonding processes and machines have been developed and put into use. The latter processes use the film-carrier technique to effect gang bonding.

The foregoing processes effect thermocompression bonds. Although the prior art mentions welding as an alternative to thermocompression bonding, so far as is known to applicants, gang welding of leads for semiconductor devices has not been commercially successful. The present invention provides an electrode assembly for effecting gang welding of leads for semi-conductor devices.

The present invention provides a gang weld electrode assembly which may be used with automatic bonding apparatus such as that disclosed in copending U.S. patent application Ser. No. 511,835 filed Oct. 3, 1974 now U.S. Pat. No. 3,949,925, to simultaneous weld all 16 leads of a semiconductor chip in a single automatic operation. The apparatus shown and described in U.S. patent application Ser. No. 511,835 now U.S. Pat. No. 3,949,925 has previously been used for thermocompression bonding of leads.

Although welding has been used with solid state devices in the past, it has never been trouble-free. The main problems are critical alignment of the opposed electrodes and variations in part thickness of the work piece. The individual spot electrodes must be aligned such that the work surfaces are planar. Due to the size and configuration of the leads of semiconductor chips, a planar peripheral configuration must be provided. In addition, this configuration must be sustained for long periods of time in order that the electrode may be used on a production basis.

The second problem, variations in the thickness of the work piece (i.e., the leads to be welded together), is perhaps even more troublesome. It is imperative that a constant mechanical force be applied to the work piece before, during and after the time current flows through the electrodes in order to impose and maintain the proper conditions for heating and welding the leads together. If the electrodes fail to apply a steady pressure against the work piece, one or more lead pairs may not weld. Moreover, increased contact resistance may cause excessive heating, resulting in burning of the electrodes. Additionally, if there is a loss of contact between the electrode and the work piece, destructive arcing at the electrode faces may occur thereby shortening the life of the electrode.

The present invention overcomes both of these problems by providing a compliant electrode comprising a plurality of independent spot electrodes which can each follow the deformation of a single lead pair during the welding operation on a lead pair by lead pair basis. An approach toward the concept of using individual compliant electrodes is set forth in U.S. Pat. No. 2,266,424. In this patent, a plurality of independent electrodes are semi-independently biased against a work piece by a resilient rubber block. This welding electrode is, however, not concerned with the problems of welding semiconductor leads.

The compliant electrode described in the above-identified patent is inadequate for many reasons. Initially, rubber ages and is therefore neither durable nor dependable. In addition, rubber does not have a linear spring coefficient and cannot provide a controlled, known and stable spring constant. Furthermore, since each of the plurality of spot electrodes is attached to a single rubber block, the displacement of each of the spot electrodes is not truly independent of the others.

These and other deficiencies of the prior art are overcome and further improvements appropriate to welding semiconductor leads are provided by supporting each of the spot electrodes on a different one of a plurality of independent parallelogram support members in the manner disclosed below. Such a support provides a means for biasing the spot electrodes against the work piece with a desired very rapid spring rate thereby ensuring constant contact between the electrodes and the work piece during the entire welding operation.

Another feature of the present invention is control over current flow. A constant, predictable current flow is imperative to a consistent and satisfactory welding operation. Among the parameters which effect the current flow are the resistance of the work piece. As noted above, the thickness of the leads being bonded varies from lead to lead. Such variations in the thickness of the leads result in variations in work piece resistance, and therefor current flow. In order to compensate for these irregularities and to provide the proper current flow through each electrode, the electrode is designed such that the electrical resistance of the electrode is much greater than that of the work piece. When constructed in such a manner, the electrode approximates a current source and hence each individual weld is not significantly effected by variations in lead resistance. That is, quantum changes in work piece resistance become less significant since they represent a small percentage change in the overall resistance of the electrode/work piece electrical system.

For the purpose of illustrating the invention, there is shown in the drawings a form which is presently preferred; it being understood, however, that this invention is not limited to the precise arrangements and instrumentalities shown.

DETAILED DESCRIPTION OF THE PREFERRED EMBODIMENT

Figure 1:
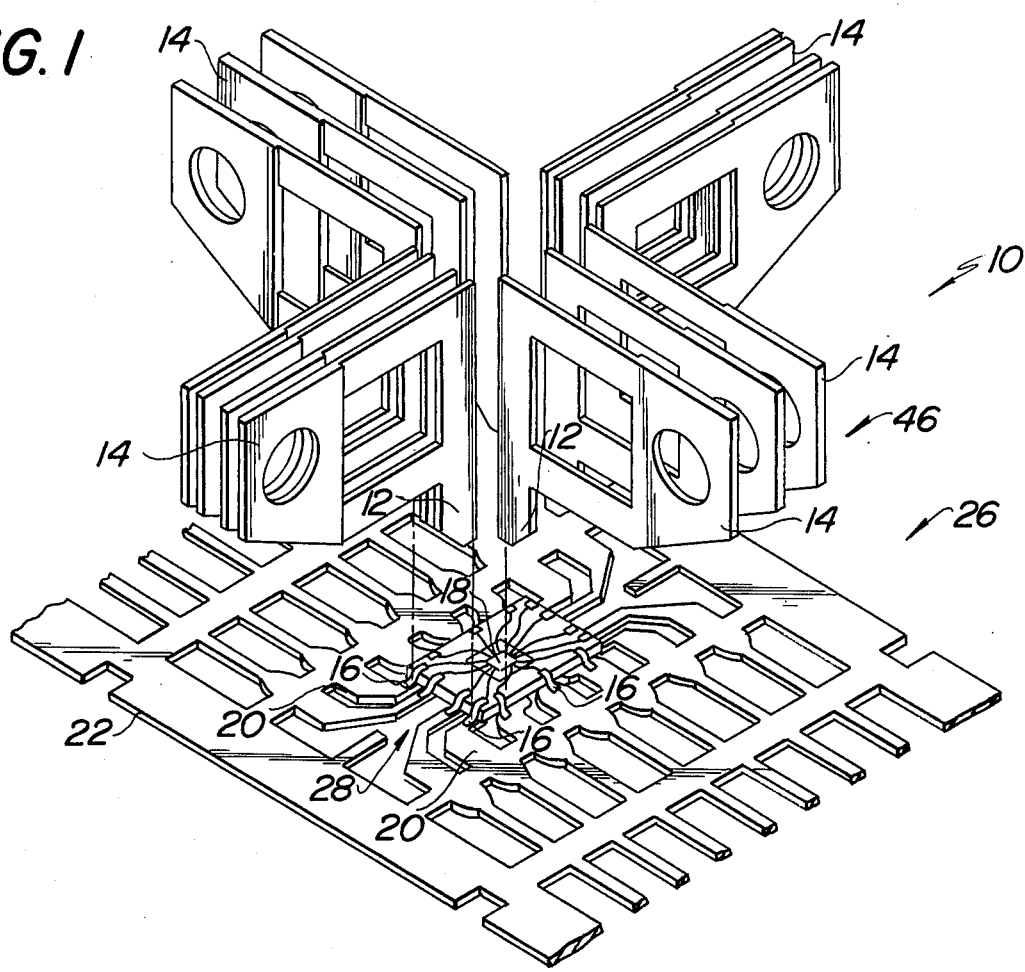
FIG. 1 is a perspective view of a complex electrode with the housing removed.

Referring now to the drawings wherein like numerals indicate like elements, there is shown in FIG. 1 a complex electrode assembly constructed in accordance with the principles of the present invention and designated generally as 10.

Electrode assembly 10 comprises a plurality of spot electrodes 12 each depending from a different parallelogram support member 14. Each electrode/parallelogram support member pair is preferably a unitary metallic element constructed of Mallory M-3 alloy. Mallory M-3 alloy is similar to Copper Development Association No. 182 alloy.

In the preferred application of the present invention, complex electrode 10 is utilized to weld the intermediate leads 16 of a semiconductor chip 18 to the outer leads 20 of an outer lead frame 22. A housing 24 (shown in FIGS. 2–4 and described below) in conjunction with parallelogram support member 14 supports each electrode 12 in a planar peripheral configuration with respect to work piece 26. More particularly, housing 24 positions each electrode 12 in alignment with a different intermediate lead/outer lead pair (hereinafter lead pair 28) of work piece 26.

Resistance welding is dependent upon two factors — heat and pressure. Both must be constant and controlled during the welding operation to produce a satisfactory weld. As will be shown in greater detail below, the shape of metallic parallelogram support member 14 provides both desired parameters.

Figure 3:
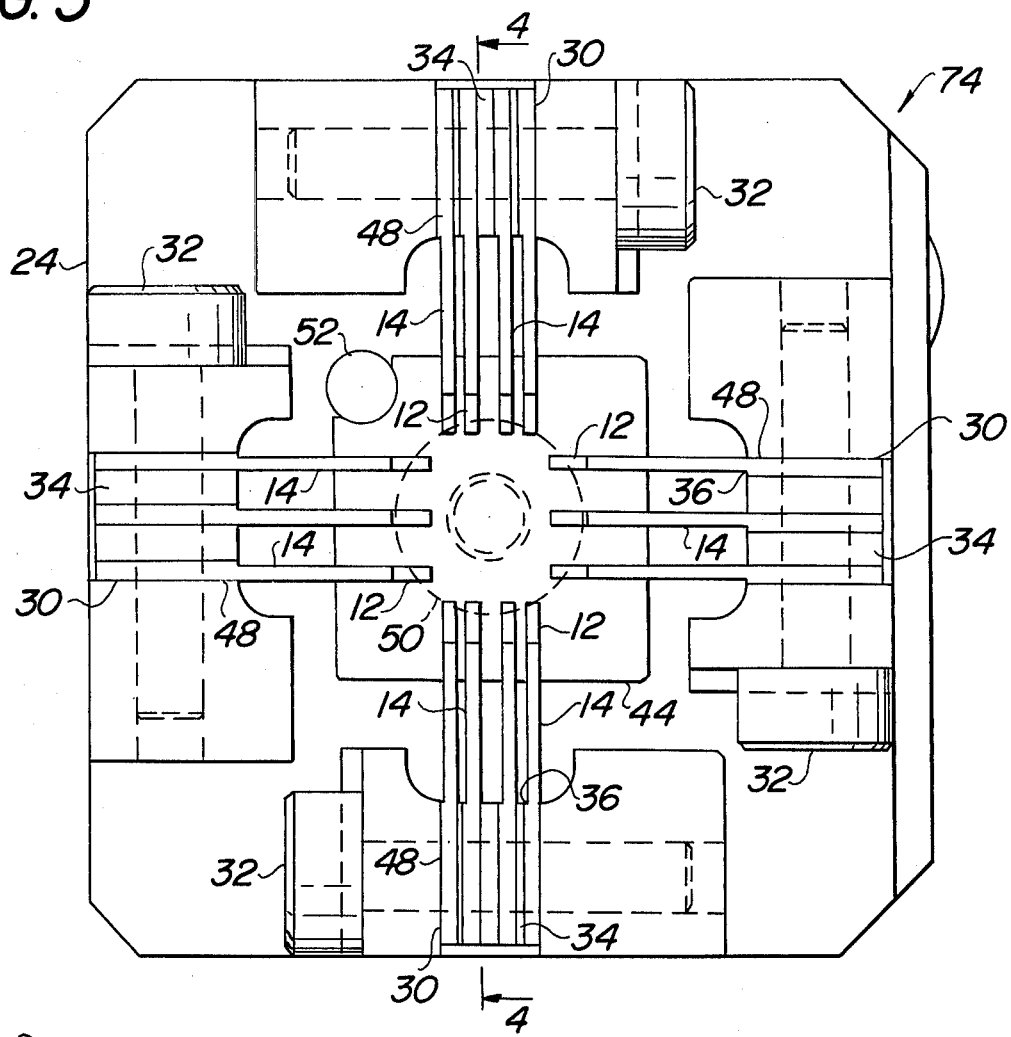
FIG. 3 is a bottom plan view of the electrode assembly shown in FIG. 2.
Figure 4:
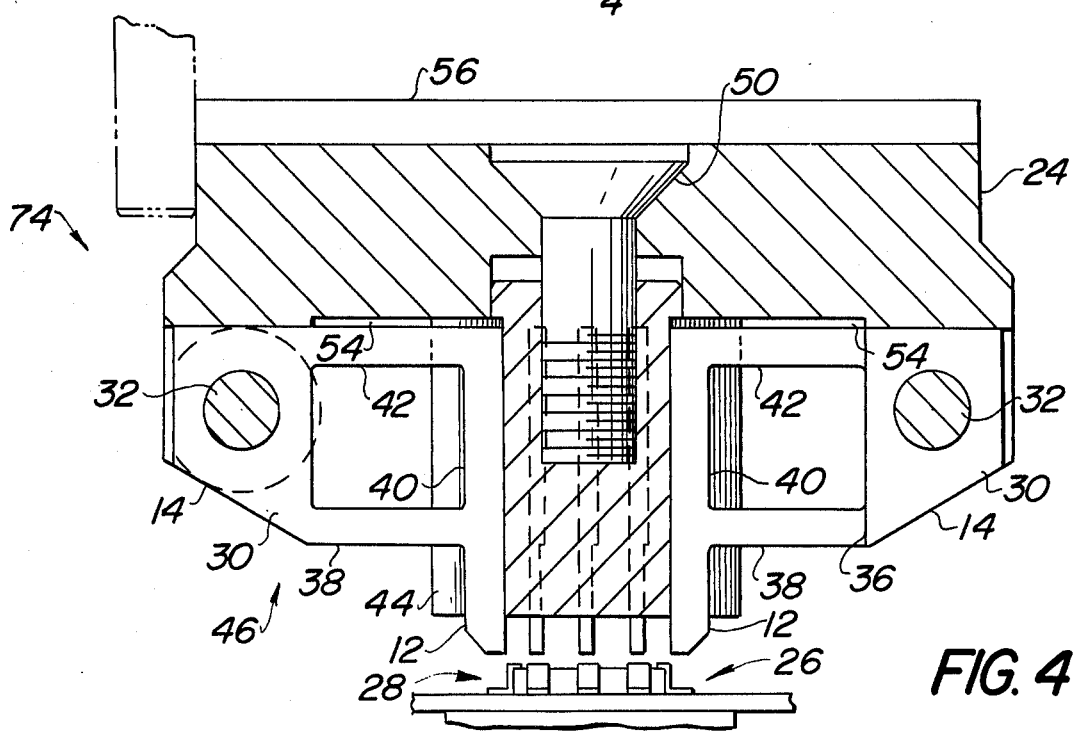
FIG. 4 is a cross-sectional view of the electrode assembly taken along 4—4 of FIG. 3.

Referring now to FIGS. 1, 3 and 4, each parallelogram support member 14 is supported in a plane perpendicular to the plane of work piece 26 by housing 24. More particularly, a first leg 30 of each parallelogram support member 14 is fixedly attached to housing 24 by a contact screw or other appropriate fastener 32 extending through the back leg 30 and clamping it in position. As best seen in FIG. 3, adjacent support members 14 are supported in spaced parallel relation by spacers 34. The spacing between support members 14 is further assured by a shoulder 36 on the first leg 30 of each support member 14.

The remaining legs 38, 40 and 42 of each parallelogram support member 14 are constrained for movement in the vertical direction only (the direction perpendicular to the plane of work piece 26) by guide plug 44. Each support member/spot electrode pair (hereinafter resilient electrode 46) is secured in a different slot 48 in plug 44. Guide plug 44 is secured to housing 24 by a screw 50. Proper alignment of gudie plug 44 is assured by locator pin 52.

A cavity 54 is provided between leg 42 of support member 14 and housing 24 to permit deformation of each leg 42 towards horn 56. So constructed, each parallelogram support member 14 is resiliently deformable into a stressed position when the spot electrode associated therewith is biased against work piece 26. In this stressed position, each parallelogram support member 14 acts as an independent spring member applying a controlled, predictable constant force to the spot electrode 12 with which it is associated both before, during and after current is passed through work piece 26.

Figure 2:
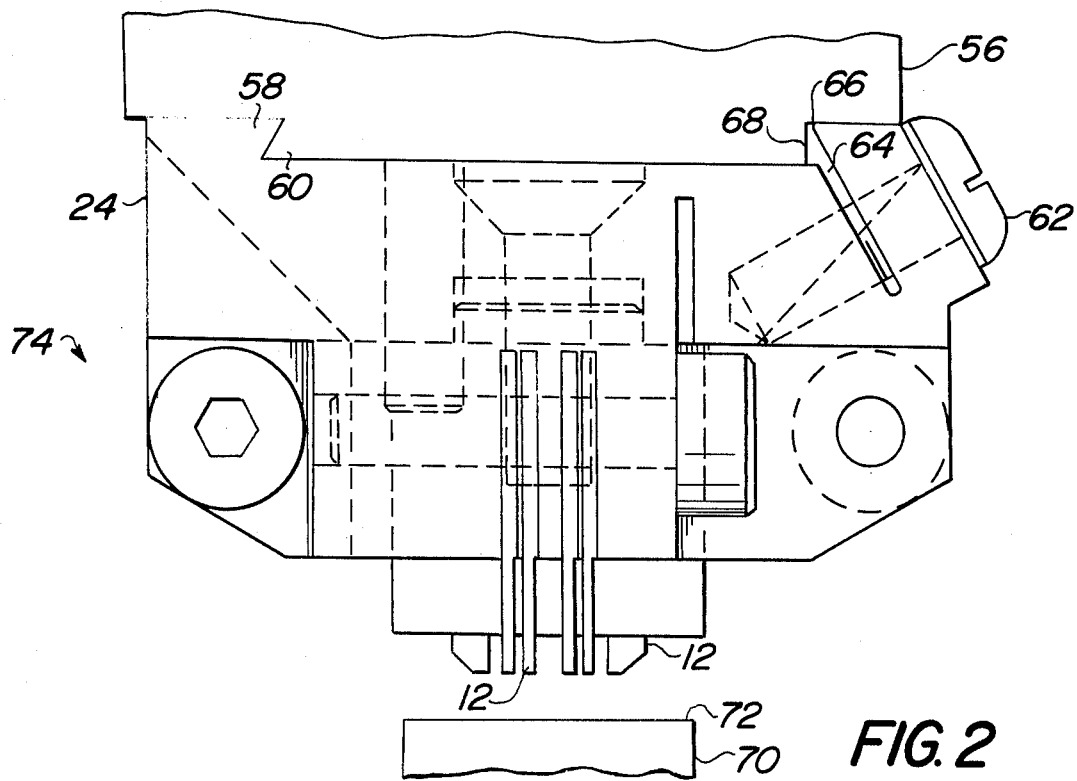
FIG. 2 is a side elevational view of the electrode assembly.
Figure 5:
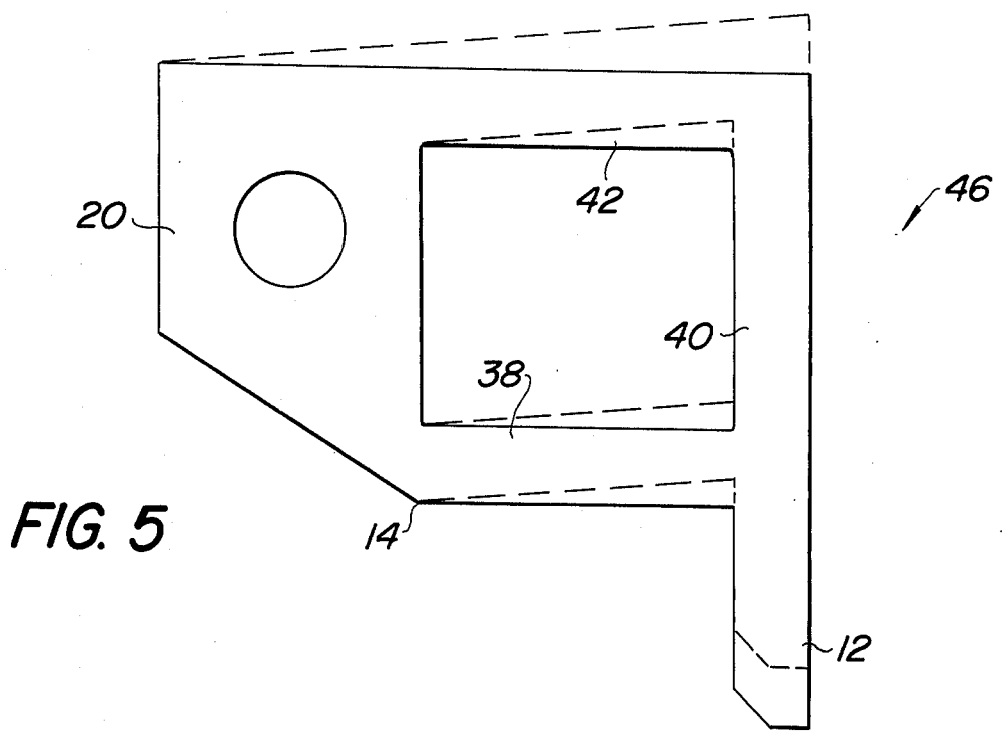
FIG. 5 is an enlarged view of a resilient electrode in both the stressed (dotted line) and unstressed (solid line) positions.

The operation of electrode assembly 10 can better be understood with reference to FIGS. 2, 4 and 5. As best shown in FIG. 2, housing 24 depends from horn 56 and is positioned opposite gross electrode 70. Housing 24 is secured to horn 56 by mating ports 58 and 60 of a dove tail in housing 24 and horn 56, respectively and set screw 62. Particularly, when set screw 62 is tightened, the gap 64 in housing 24 is reduced and edge 66 biased against step 68 in horn 56. The resultant friction between edge 66 and step 68 tightly secures the housing 24 to horn 56.

Spot electrodes 12 are supported by housing 24 in a plane parallel to mating surface 72 of gross electrode 70. Gross electrode 70, spot electrodes 12, parallelogram support members 14, housing 24, plug 44, screws 32 and 50, spacers 34 and horn 56 are all preferably metallic and therefore conductive. While the particular metal used is not critical, it is advantageous to choose the metal such that the resistance of the elements comprising the electrode assembly 74 be high in comparison to the resistance of the work piece in order that each spot electrode 12 can act as an independent current source. The reason for this limitation will be discussed in greater detail below.

The relative positions of electrode assembly 10, work piece 26, and gross electrode 70 just prior to the welding operation are illustrated in FIG. 4. When the work piece has been properly positioned such that each lead pair 28 is aligned with a different spot electrode 12, electrode assembly 10 is lowered (or raised) so that spot electrodes 10 are brought into contact with work piece 26.

As electrode assembly 10 is lowered into the welding position, each parallelogram support member deforms an amount dictated by the thickness of the lead pair 28 with which it is associated. Significantly, each parallelogram support member 14 operates as an independent spring element, exerting a predictable force on its associated spot electrode 12.

Figure 6:
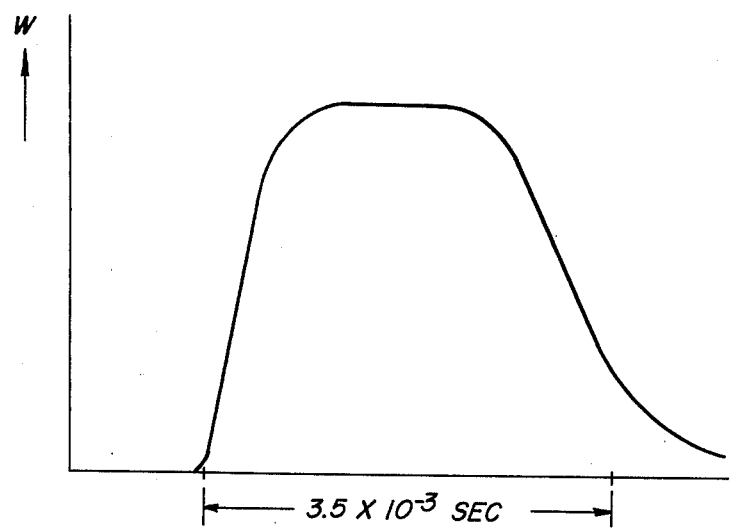
FIG. 6 is a graph of a typical power dissipation characteristic of a capacitive discharge power supply applied to the electrode assembly illustrated in FIG. 2.

After electrode assembly 10 is lowered into the welding position and each resilient electrode 46 has deformed into the phantom position illustrated in FIG. 5, electrical current is passed through work piece 26 to heat lead pairs 28 into a fused state. In a typical application, a capacitive discharge having the energy dissipation characteristics shown in FIG. 6 is applied to horn 56. Depending upon the exact voltage chosen, a current having a maximum of 100 to 150 amps peak flows through lead pairs 28. The energy applied to the lead pairs is 45 to 60 watts seconds for 16 leads. Significantly, the capacitor discharges 90 percent of its power in $3.5 \times 10^{-3}$ seconds. This high energy burst causes lead pairs 28 to pass from the solid to the fused state in an extremely short period of time. Additionally, due to irregularities in the thickness of each lead pair, certain lead pairs 28 flow more readily than others. As a result of the particular arrangement of metallic resilient electrodes 46, each support member 14 exhibits a highly predictable and constant spring rate and rapidly follows part deformations throughout the entire welding operation. Accordingly, the pressure applied by support members 14 to spot electrodes 12 remains substantially constant both before, during and after the passage of current through work piece 26.

As noted above, a satisfactory weld requires not only a constant and predictable application of force but also a constant and predictable application of heat. The heat induced in work piece 26 is determined by the current passing through and the resistance of lead pairs 28. The present invention controls this parameter by controlling the current passing through lead pairs 28. Particularly, the current passing through lead pairs 28 is kept constant by designing electrode assembly 74 such that its overall resistance is very high with respect to the resistance of the lead pairs 28. By providing electrode assembly 74 with such a high resistance, each spot electrode 12 acts as a current source and the current passing through lead pairs 28 is not significantly affected by variations in the resistance of lead pairs 28. Stated otherwise, the change in current for a given change in lead pair resistance is reduced for any particular change due to the high resistance of electrode assembly 74.

In the preferred embodiment described herein, the high resistance of electrode assembly 74 is due to two factors — the resistance of the material chosen for and the shape of the electrode assembly 74. To this effect, the shape of parallelogram support member 14 is again advantageous since the extention of arms 38, 40 and 42 provide increased resistance to electrode assembly 74. While the particular metal or metals used in constructing electrode assembly 74 will depend upon the specific parameters of any particular application, it has been found advantageous to use Mallory M-3 alloy for the entire electrode assembly when welding leads made of Copper Development Association Alloy No. 42.

As an alternative to the preferred embodiment described above, the current passing through lead pairs 28 can be controlled by connecting each spot electrode to an ideal current source. As used herein, the term ideal current source describes a source of current which supplies a substantially constant current for any change in lead pair resistance which will be encountered during the normal welding operation. The above described embodiment operates in this manner by applying a high level voltage to each spot electrode 12 through a highly resistive element in series with each electrode 12.

As used in the appended claims, the term "major face" when used in reference to the parallelogram the support member shall refer to the face of parallelogram support member 14 as viewed in FIG. 4.

The present invention may be embodied in other specific forms without departing from the spirit or essential attributes thereof and, accordingly, reference should be made to the appended claims, rather than to the foregoing specification as indicating the scope of the invention.

What is claimed is:

1. An electrode assembly for welding the leads of a semiconductor chip to an outer lead frame comprising:
   a gross electrode having an extended planar surface adapted to contact one side of a workpiece comprising the leads of a semiconductor chip and an outer lead frame;
   a plurality of spot electrodes adapted to contact the opposite side of said workpiece at spaced points; and
   support means for supporting said spot electrodes in spaced relation, said support means including a housing and a plurality of metallic parallelogram support members, the major face of each of said support members lying in a plane perpendicular to the planar surface of said gross electrode, each of said plurality of parallelogram support member including a first leg fixedly attached to said housing and a second leg supporting a different one of said spot electrodes, each of said parallelogram support members being resiliently deformable and each of said second legs being displaceable in a plane perpendicular to the planar surface of said gross electrode when the electrode supported thereby is biased against said workpiece whereby each said electrode is responsive to dimensional changes in said workpiece and constant contact is maintained between said workpiece and said spot electrodes during the entire welding operation.

2. An electrode assembly as claimed in claim 1 including means for applying a substantially constant current to said spot electrodes.

3. An electrode assembly as claimed in claim 2 wherein said means for applying a substantially constant current to said spot electrodes includes a conductive element of high resistance in series with each said spot electrode.

4. An electrode assembly as claimed in claim 1 wherein the electrical resistance of said electrode assembly is much greater than that of the work piece whereby changes in the resistance of the work piece do not significantly effect the current passed therethrough during the welding operation.

5. An electrode assembly in accordance with claim 1 wherein said electrode assembly is constructed of Copper Development Association Alloy No. 182.

6. An electrode assembly as claimed in claim 1 including spacers between adjacent electrodes for assuring the proper spacing therebetween.

7. An electrode assembly as claimed in claim 1 wherein each parallelogram support member includes a step therein for assuring the proper spacing between adjacent electrodes.

* * * * *